(12) United States Patent
Kubota et al.

(10) Patent No.: US 11,662,464 B2
(45) Date of Patent: May 30, 2023

(54) SENSOR AND DISTANCE MEASURING DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Hiroshi Kubota, Tokyo (JP); Nobu Matsumoto, Ebina Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 681 days.

(21) Appl. No.: 16/556,490

(22) Filed: Aug. 30, 2019

(65) Prior Publication Data
US 2020/0300621 A1 Sep. 24, 2020

(30) Foreign Application Priority Data

Mar. 22, 2019 (JP) .............................. JP2019-055105

(51) Int. Cl.
*G01S 17/10* (2020.01)
*G01C 3/08* (2006.01)
*G01J 1/44* (2006.01)
(52) U.S. Cl.
CPC ................ *G01S 17/10* (2013.01); *G01C 3/08* (2013.01); *G01J 1/44* (2013.01); *G01J 2001/4466* (2013.01)

(58) Field of Classification Search
CPC .......... G01S 17/10; G01S 17/14; G01S 17/42; G01S 7/4863; G01C 3/08; G01J 1/44;
(Continued)

(56) References Cited

U.S. PATENT DOCUMENTS 4,963,727 A 10/1990 Cova
5,532,474 A * 7/1996 Dautet ............... H03K 17/0416
250/214 R
(Continued)

FOREIGN PATENT DOCUMENTS

EP 3419168 A1 12/2018
JP H02-170477 A 7/1990
(Continued)

OTHER PUBLICATIONS

Extended European Search Report dated Oct. 13, 2020, mailed in counterpart European Patent Application No. 19214739.5, 18 pages.
(Continued)

*Primary Examiner* — Tony Ko
(74) *Attorney, Agent, or Firm* — Kim & Stewart LLP

(57) ABSTRACT

A sensor includes an avalanche photodiode (APD), a first resistor, a second resistor, and a rectification element. The first resistor is connected between a current output terminal of the APD and a first output terminal. The second resistor and the rectification element are connected in series between the current output terminal and a second output terminal.
(Continued)

The rectification element is connected between the second resistor and the second output terminal.

16 Claims, 10 Drawing Sheets

(58) Field of Classification Search
CPC ....... G01J 2001/4466; H01L 27/14603; H01L 27/14609; H01L 27/14625; H01L 27/14636
See application file for complete search history.

(56) References Cited

U.S. PATENT DOCUMENTS

| | | |
|---|---|---|
| 2002/0145107 A1 | 10/2002 | Deschamps et al. |
| 2015/0296161 A1 | 10/2015 | Saito et al. |
| 2016/0191829 A1 | 6/2016 | Guo et al. |
| 2017/0307738 A1 | 10/2017 | Schwarz et al. |
| 2018/0275280 A1 | 9/2018 | Eken et al. |
| 2018/0284239 A1 | 10/2018 | LaChapelle et al. |
| 2020/0182692 A1 | 6/2020 | Lilic et al. |

FOREIGN PATENT DOCUMENTS

| | | |
|---|---|---|
| JP | 2004-509586 A | 3/2004 |
| JP | 2015-204498 A | 11/2015 |
| JP | 2018-163156 A | 10/2018 |

OTHER PUBLICATIONS

Partial European Search Report dated Jul. 21, 2020 filed in counterpart European Patent Application No. 19214739.5, 17 pages.
Ekkehard Overbeck et al., "Silicon avalanche photodiodes as detectors for photon correlation experiments", Review of Scientific Instruments, American Institute of Physics, vol. 69, No. 10, Oct. 1, 1998, pp. 3515-3523.
Japanese Notice of Reasons for Refusal dated Jul. 5, 2022 in corresponding Japanese Patent Application No. 2019-055105, 13 pages (with Translation).
Notice of Reasons for Refusal dated Jan. 10, 2023 in corresponding Japanese Patent Application No. 2019-055105 with English translation, 10 pages.

\* cited by examiner

SENSOR AND DISTANCE MEASURING DEVICE

CROSS-REFERENCE TO RELATED APPLICATION

This application is based upon and claims the benefit of priority from Japanese Patent Application No. 2019-055105, filed Mar. 22, 2019, the entire contents of which are incorporated herein by reference.

FIELD

Embodiments described herein relate generally to a sensor and a distance measuring device including a sensor.

BACKGROUND

A distance measuring device called a light detection and ranging (LIDAR) device is known. A LIDAR device radiates laser light to a target object, measures the intensity of light reflected from the target object using a sensor, and measures a distance to the target object based on a light intensity signal output from the sensor. A sensor using a silicon photomultiplier element (SiPM) is known as a sensor that can be used in LIDAR devices.

The sensor used in LIDAR may include an avalanche photodiode and a quench resistor. While such a sensor generally has high sensitivity, the maximum current is restricted by the quench resistor. Thus, when light of a high intensity is incident, a generated carrier may not be correspondingly emitted. If the carrier is not emitted, the sensor cannot properly function, or otherwise sensing performance may be decreased. Such a period non-usability may be significantly increased depending on the intensity of the incident light. In addition, during this period, a reverse-bias voltage of the avalanche photodiode may be significantly decreased due to a decrease in voltage caused by the quench resistor.

In addition, even in a case where incident light does not have a high intensity, the time period needed for the quench resistor to recover to an operative state may be relatively long.

DETAILED DESCRIPTION

In general, according to an embodiment, a sensor includes an avalanche photodiode (APD), a first resistor, a second resistor, and a rectification element. The first resistor is between a current output terminal of the APD and a first output terminal. The second resistor and the rectification element are in series between the current output terminal and a second output terminal. The rectification element is between the second resistor and the second output terminal.

Hereinafter, example embodiments will be described with reference to the drawings.

Figure 1:
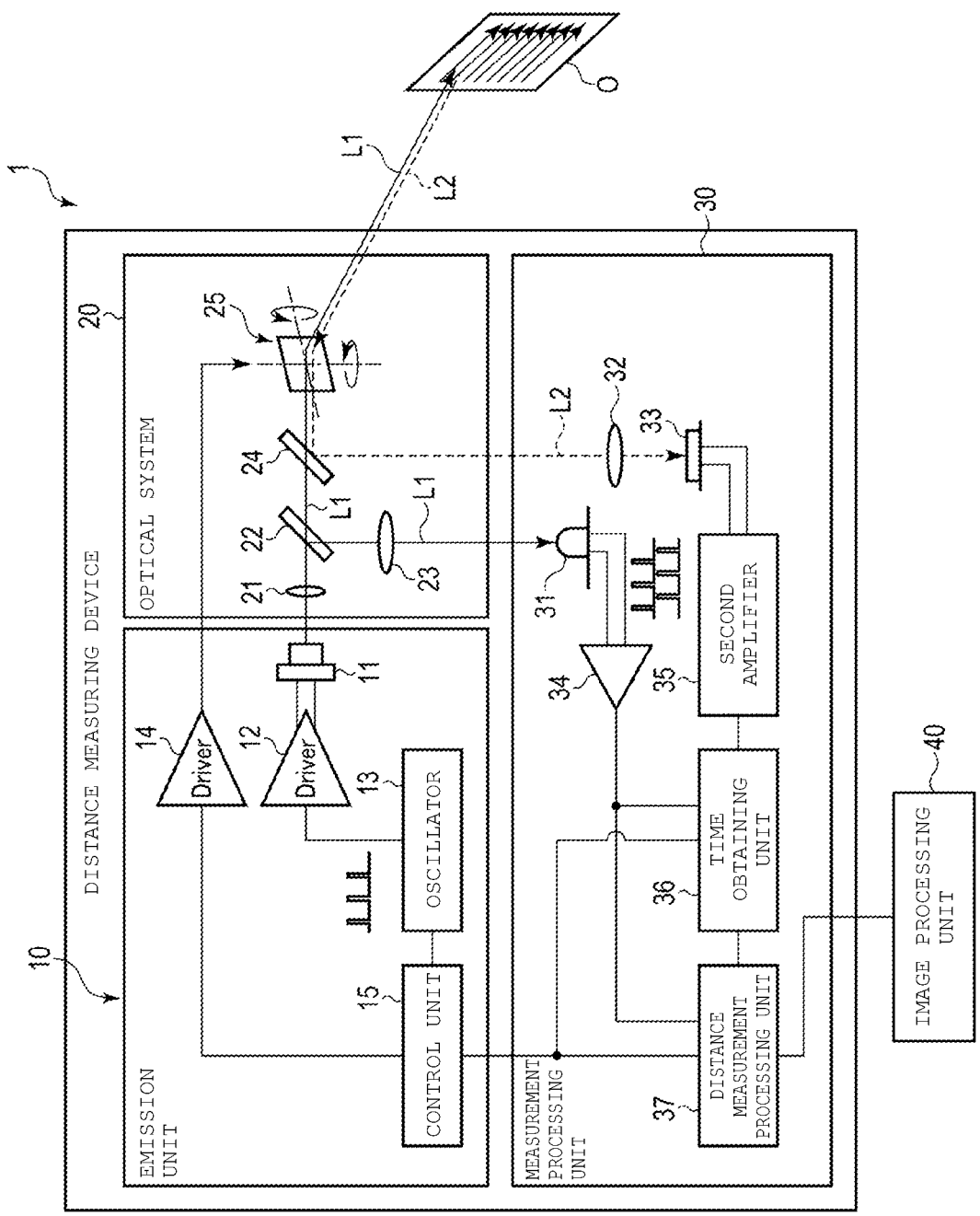
FIG. 1 is a diagram illustrating a schematic overall configuration of a distance measuring device according to an embodiment.

FIG. 1 is a diagram illustrating a schematic overall configuration of a distance measuring device according to the embodiment. A distance measuring device 1 includes an emission unit 10, an optical system 20, a measurement processing unit 30, and an image processing unit 40.

The emission unit 10 intermittently emits laser light L1. The emission unit 10 includes a light source 11, a first drive circuit 12, an oscillator 13, a second drive circuit 14, and a control unit 15.

The light source 11 emits the laser light L1 as pulses. The light source 11 is a laser light source such as a laser diode.

The first drive circuit 12 supplies a drive current for driving the light source 11. The first drive circuit outputs the drive current to the light source 11 depending on a pulse signal generated in the oscillator 13.

The oscillator 13 generates the pulse signal under control of the control unit 15. The oscillator 13 outputs the generated pulse signal to the first drive circuit 12.

The second drive circuit 14 supplies a drive current for driving a mirror 25 of the optical system 20 to the mirror 25 under control of the control unit 15.

For example, the control unit 15 includes a CPU and memory. The memory stores a program for operating the distance measuring device 1. The CPU controls the first drive circuit 12 and the second drive circuit 14 in accordance with the program stored in the memory.

The optical system 20 directs the laser light L1 emitted from the emission unit 10 to a target object O and the reflected light L2 (which is a reflected portion of the laser light L1) reflected from the target object O to be incident on the measurement processing unit 30. The optical system 20 includes a lens 21, a first optical element 22, a lens 23, a second optical element 24, and the mirror 25.

The lens 21 is disposed on an emission optical path of light emitted from the light source 11. The lens 21 collimates the laser light L1 emitted from the light source 11 and guides the laser light L1 to the first optical element 22.

The first optical element 22 separates the laser light L1 guided by the lens 21 in the direction of the second optical element 24 and the direction of a photosensor 31 of the measurement processing unit 30. For example, the first optical element 22 is a beam splitter.

The lens 23 condenses the laser light L1 from the first optical element 22 and guides the laser light L1 to the photosensor 31.

The second optical element 24 transmits the laser light L1 from the first optical element 22 in the direction of the mirror 25 and reflects the reflected light L2 from the mirror 25 in the direction of the sensor 33 of the measurement processing unit 30. For example, the second optical element 24 is a half mirror.

The mirror 25 reflects incident light. The mirror 25 is a polygon mirror having different angles of mirror surfaces. Alternatively, the mirror 25 may be a swinging mirror. For example, reflective surfaces of the mirror 25 are rotatable about two rotating shafts intersecting with each other. The mirror 25 is driven in accordance with the drive current supplied from the second drive circuit 14.

The measurement processing unit 30 measures a distance to the target object O based on the reflected light L2 emitted from the optical system 20. The measurement processing unit 30 includes the photosensor 31, a lens 32, a sensor 33, a first amplifier 34, a second amplifier 35, a time obtaining unit 36, and a distance measurement processing unit 37.

For example, the photosensor 31 is a photodiode and outputs an electric signal by receiving the laser light L1 guided through the lens 23.

The lens 32 condenses the reflected light L2 from the second optical element 24 and guides the reflected light L2 to the sensor 33.

The sensor 33 generates an electric signal upon receiving the reflected light L2 incident from the lens 32. For example, the sensor 33 is a photomultiplier element using a semiconductor and is particularly in this example a silicon photomultiplier element (SiPM). The SiPM is a device in which avalanche photodiodes (APDs), called single-photon avalanche diodes (SPADs), are used in Geiger-mode and arranged in a multi-pixel array. Each SPAD causes avalanche breakdown in response to light incident thereon and outputs an electric signal. A plurality of SPADs may form a region (referred to as a pixel or a channel), and an output of SPADs in the region may be used in common. In this case, an electric signal corresponding to the total outputs of SPADs belonging to the region is output from the region. A configuration of the sensor 33 will be described in detail below.

The first amplifier 34 amplifies the electric signal output from the photosensor 31 and outputs the electric signal to the time obtaining unit 36 and the distance measurement processing unit 37.

For example, the second amplifier 35 is a transimpedance amplifier and amplifies the electric signal based on the reflected light L2. For example, the second amplifier 35 amplifies and converts a current signal output from the sensor 33 into a voltage signal as a measurement signal.

The time obtaining unit 36 generates a time series signal with respect to signal intensity by performing analog-to-digital (AD) conversion on the measurement signal based on the reflected light L2 or obtains a rise time of the measurement signal.

The distance measurement processing unit 37 detects a peak time of the time series signal obtained by the time obtaining unit 36 and measures the distance to the target object O based on a difference in time between this peak time and a radiation time (emission time) of the laser light L1 or a difference in time between the rise time and the radiation time of the laser light L1.

Figure 2:
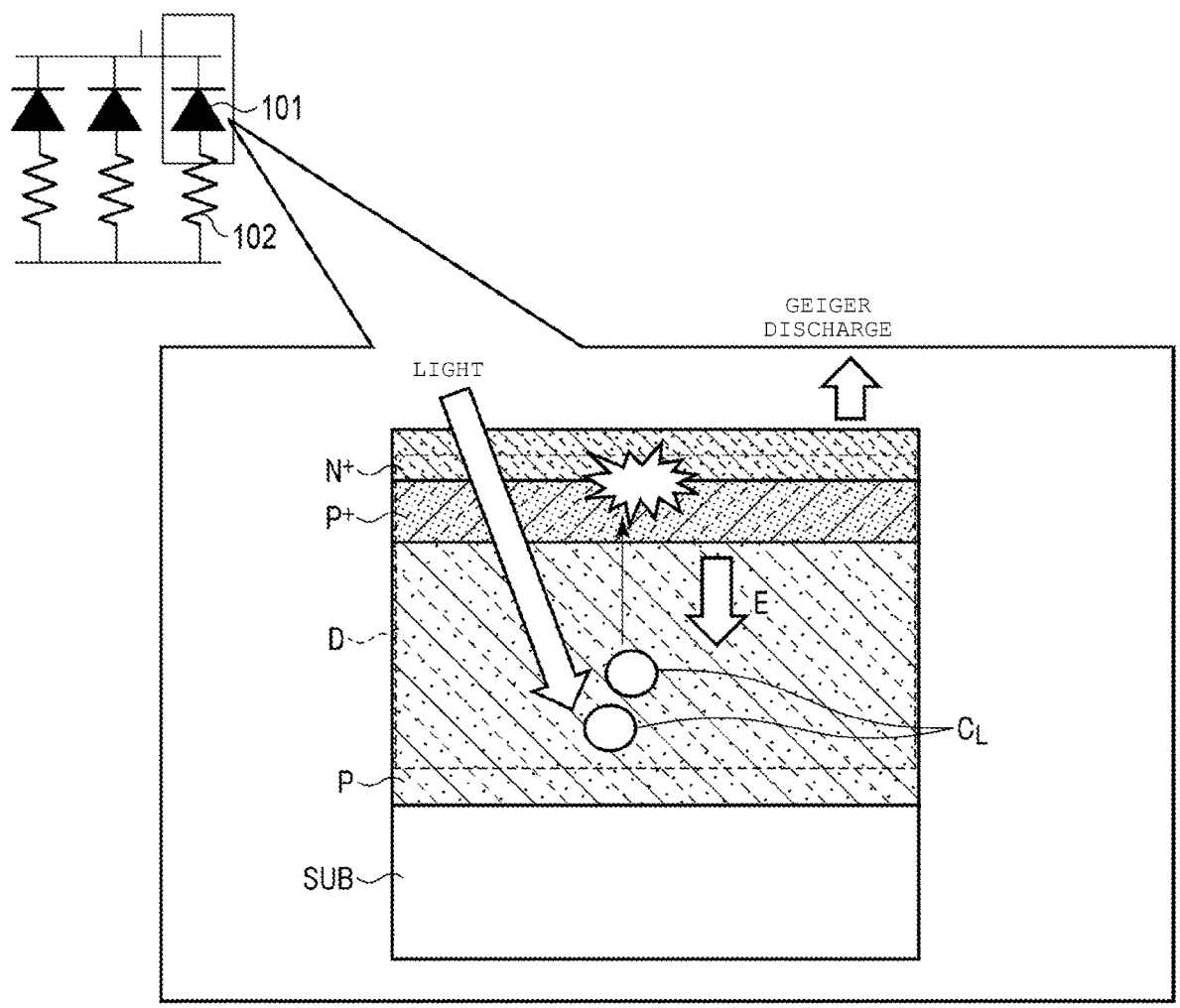
FIG. 2 is a diagram illustrating a configuration and an operation principle of one SPAD.

Hereinafter, a configuration of the sensor 33 will be described. FIG. 2 is a diagram illustrating a configuration and an operation principle of the SPAD. Each SPAD includes an APD 101 and a quench resistor 102. The quench resistor 102 is connected to a current output terminal of the APD 101.

The APD 101 in the example in FIG. 2 includes a thick P-type semiconductor layer and a thin N-type semiconductor layer. Specifically, for example, the APD 101 includes a substrate SUB, a P-type semiconductor layer P, a P-plus-type semiconductor layer $P^+$, and an N-plus-type semiconductor layer N. For example, the substrate SUB is a P-type semiconductor substrate. The P-type semiconductor layer P is stacked on the substrate SUB. The P-type semiconductor layer P is a thin P-type semiconductor layer having a lower impurity concentration than the P-plus-type semiconductor layer P. The P-type semiconductor layer P may be thin epitaxial layer, for example. The P-plus-type semiconductor layer $P^+$ is a semiconductor layer in which a P-type impurity has a higher impurity concentration than the P-type semiconductor layer P. The N-plus-type semiconductor layer $N^+$ is a semiconductor layer of a high electron concentration in which an N-type impurity is introduced. Electrodes, not specifically illustrated, are formed in the N-plus-type semiconductor layer N. A high reverse-bias voltage is applied to the APD 101 through the electrodes in a direction in which the substrate side is negative.

As illustrated in FIG. 2, a depletion layer D is formed near a junction region between the P-type semiconductor layer and the N-type semiconductor layer. When light is incident on the depletion layer D, an electron-positive hole pair as a carrier $C_L$ is generated in the depletion layer D.

Since a high reverse-bias voltage is applied to the APD 101, the carrier $C_L$ generated in the depletion layer D drifts due to an electric field E caused by the reverse-bias voltage. In the example in FIG. 2, in the carrier $C_L$, the electron is accelerated in the direction of the surface (N-plus-type semiconductor layer $N^+$), and the positive hole is accelerated in the direction of the substrate. The electron accelerated toward the N-plus-type semiconductor layer $N^+$ collides with an atom under a strong electric field near the PN junction. The electron colliding with the atom ionizes the atom and generates a new electron-positive hole pair. When the reverse-bias voltage exceeds a breakdown voltage, the generation of the electron-positive hole pair is repeated. Such avalanche breakdown discharges the APD 101. Such discharge is called Geiger discharge. In such a manner, an electric signal related to the Geiger discharge and subsequent recovery is output from one SPAD.

A current output from the APD 101 flows into the quench resistor 102. At this point, the bias voltage is decreased due to a decrease in voltage. When the bias voltage is decreased and becomes less than the breakdown voltage, the Geiger phenomenon stops. Furthermore, when a flow of recovery current charging a capacitance such as a junction capacitance of the APD 101 ends, the current output stops. When the Geiger phenomenon stops and the current output is reduced to a certain extent, the APD 101 returns to a state where subsequent light can be received.

The APD 101 is not limited to the structure in FIG. 2. For example, the P-plus-type semiconductor layer $P^+$ may not be provided in all examples. In addition, while the APD in FIG. 2 has a structure including a thick P-type semiconductor layer and a thin N-type semiconductor layer, the APD may conversely have a structure including a thick N-type semiconductor layer and a thin P-type semiconductor layer. Furthermore, the PN junction may not be near the surface as depicted in FIG. 2. The PN junction may be formed around a boundary between the substrate SUB and a layer formed thereon, such as P-type semiconductor layer P.

Figure 3A:
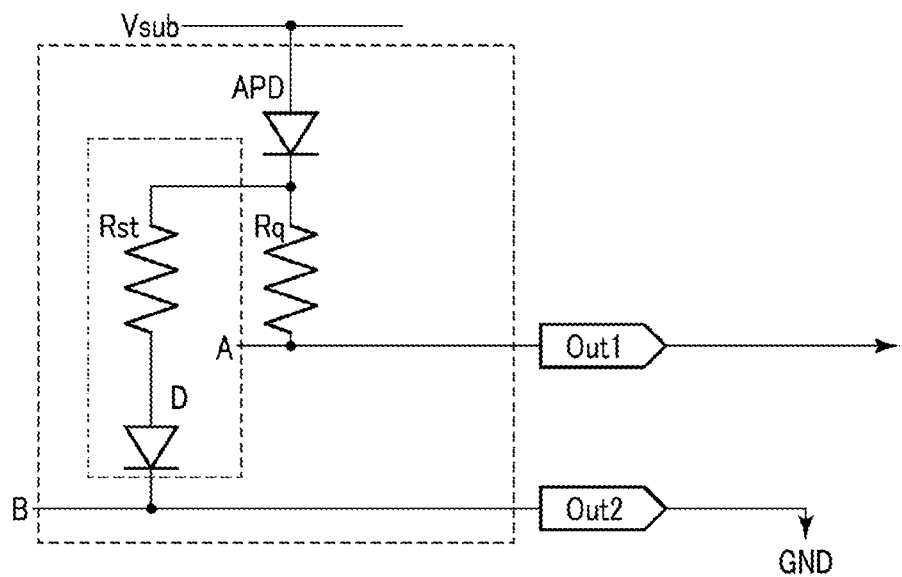
FIG. 3A is a diagram illustrating a configuration example of one SPAD in the embodiment.

FIG. 3A is a diagram illustrating a configuration example of one SPAD in the embodiment. As illustrated in FIG. 3A, one SPAD in the embodiment includes the APD, a first quench resistor Rq, a second resistor Rst, and a diode D as a rectification element.

In FIG. 3A, the APD is forwardly connected to a power supply, and a reverse-bias voltage Vsub is applied to the APD from the power supply, not illustrated, disposed in the substrate SUB. One end of the first quench resistor Rq is connected to a cathode of the APD. Another end of the first quench resistor Rq is connected to an output terminal Out1 of the sensor 33. The output terminal Out1 is connected to the second amplifier 35. When SPADs are arranged in a multi-pixel form, the SPADs may form a group. At this point, the first quench resistor Rq of the SPAD belonging to a certain group is connected to the first quench resistor Rq of another SPAD belonging to the same group at a connection point A illustrated in FIG. 3A. Accordingly, an electric signal corresponding to the total of the outputs of the SPADs belonging to the group is output to the second amplifier 35 from the output terminal Out1.

The second resistor Rst is connected in parallel with the first quench resistor Rq. A resistance value of the second resistor Rst is lower than a resistance value of the first quench resistor Rq. For example, the resistance value of the first quench resistor Rq is 250 kΩ, and the resistance value of the second resistor Rst is 2 kΩ.

The diode D is a rectification element forwardly connected to the second resistor Rst. That is, a cathode of the diode D as a current output terminal is connected to an output terminal Out2 of the sensor 33. When the SPADs are arranged in a multi-pixel form, the cathode of the diode D of the SPAD is connected to the cathode of another diode D at a connection point B illustrated in FIG. 3A. Accordingly, an electric signal corresponding to the total of the output of each diode D is output to the ground from the output terminal Out2. The diode D may be a Zener diode or an avalanche photodiode (which is different from the above-described APD).

In the configuration illustrated in FIG. 3A, when light is incident on the APD, the APD causes avalanche breakdown and outputs a current signal. The current signal from the APD flows into the first quench resistor Rq. Since the second resistor and the diode D are connected in parallel with the first quench resistor, a voltage generated in the first quench resistor due to the current signal flowing into the first quench resistor Rq from the APD is applied to the second resistor and the diode D.

When the voltage applied to the diode D exceeds a breakdown voltage of the diode D, a current flows into the diode D. Since the resistance value of the second resistor Rst is lower than the resistance value of the first quench resistor Rq, the current flowing into the diode D is higher than the current flowing into the first quench resistor Rq.

A quantity of electricity I generated per unit time when light is incident on the APD is represented by Expression 1 below.

$$I = N_p \times PDE \times G \times e \quad \text{(Expression 1)}$$

In Expression 1, Np denotes the number of photons absorbed in the APD. The detection efficiency of the APD is denoted by PDE. The gain (amplification rate) of the APD is denoted by G. The elementary charge is denoted by e. When the intensity of light incident on the APD is increased, the number Np of photons absorbed in the APD is increased. Accordingly, the quantity of electricity I is also increased based on Expression 1.

When the current flowing into the quench resistor is denoted by Iq, the carrier generated in the APD is discharged in a case where I−Iq is equal to zero or is small enough to be regarded as zero. In this case, subsequent detection by the APD can be performed. However, when I−Iq is equal to a significantly high, the carrier generated in the APD remains for a long time before dissipation. While the carrier remains, the output of the APD continues. Thus, during such a period, a subsequent detection event cannot be performed by the APD.

In the embodiment, the second resistor Rst and the diode D are connected in parallel with the first quench resistor Rq. Accordingly, even when a high intensity of light is incident on the APD, the carrier generated in the APD is discharged in a relatively short time.

Modification Example 1

Figure 3B:
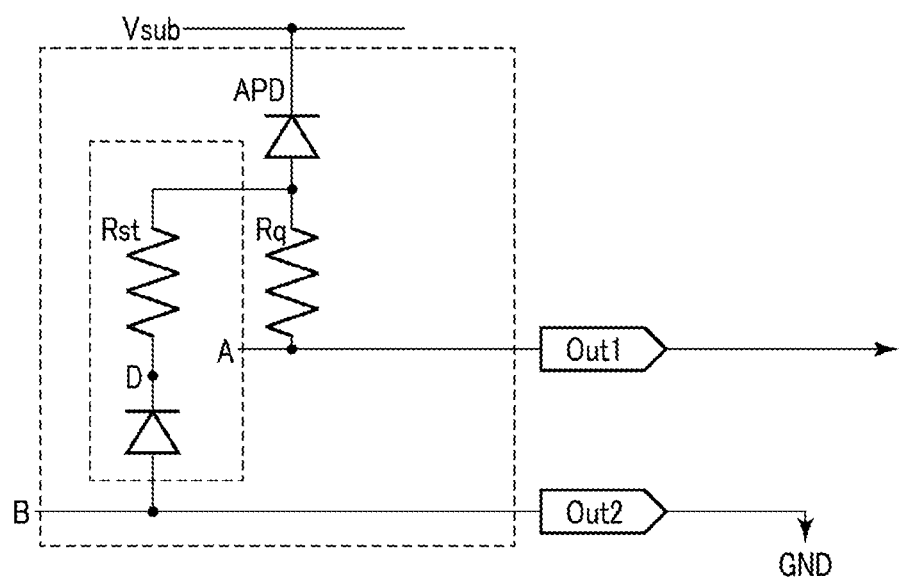
FIG. 3B is a diagram illustrating a configuration example of one SPAD in Modification Example 1.

Modification Example 1 will be described. In FIG. 3A, the APD is forwardly connected to the power supply, and the reverse-bias voltage Vsub is applied to the APD from the power supply. However, as illustrated in FIG. 3B, the APD may be reversely connected to the power supply. In this case, the diode D may be reversely connected to the second resistor Rst. That is, the APD and the diode D may be connected in the same direction. Accordingly, when the APD is reversely connected to the power supply, the diode D is reversely connected to the second resistor Rst. In addition, when the APD is forwardly connected to the power supply, the diode D is forwardly connected to the second resistor Rst.

Figure 3C:
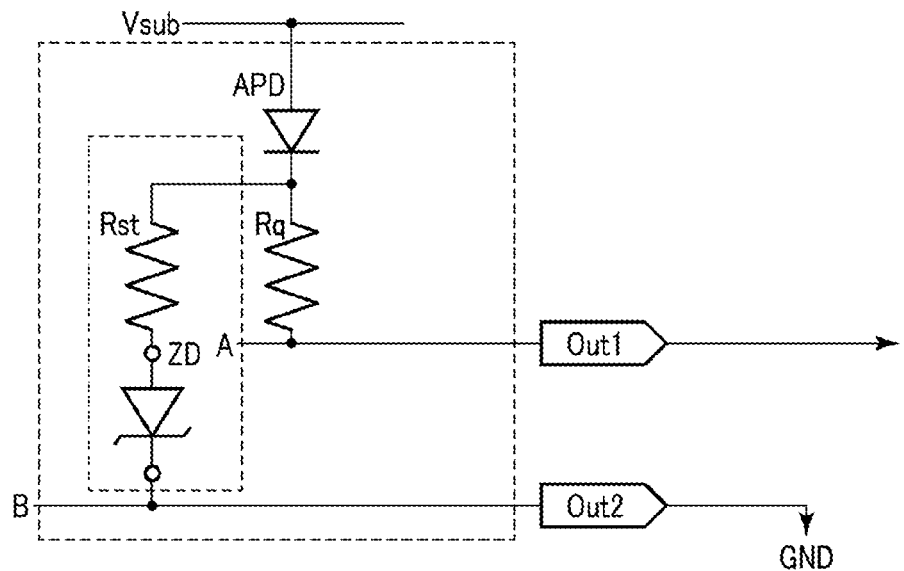
FIGS. 3C, 3D, and 3E each are a diagram to explain replacement of a rectification element.

In addition, FIG. 3A illustrates the diode D as a rectification element connected in parallel with the first quench resistor Rq. However, the rectification element is not limited to a diode. As illustrated in FIG. 3C, the diode D may be a Zener diode ZD. For example, when the power supply voltage Vsub is −30 V, the breakdown voltage is 25 V (as typically represented as a positive number), the voltage of the output terminal Out1 is approximately 0 V, and an overvoltage operating the SPAD is 0 to −5 V (represented as 0 to 5 V without a minus sign), a Zener diode ZD having a breakdown voltage of 5 V or higher is used. In this case, when a decrease in voltage caused by light exceeds the breakdown voltage, a current flows into the Zener diode ZD, and the accumulated carrier is discharged. Alternatively, the diode D may be an avalanche photodiode. The second resistor Rst restricts the current flowing into the Zener diode ZD (and the voltage applied between both ends of the Zener diode ZD) and prevents breakage of the Zener diode ZD. In addition, the second resistor Rst reduces the effect of a parasitic capacitance of the Zener diode ZD on the characteristics of the SPAD at the time of a typical operation.

Modification Example 2

Figure 3D:
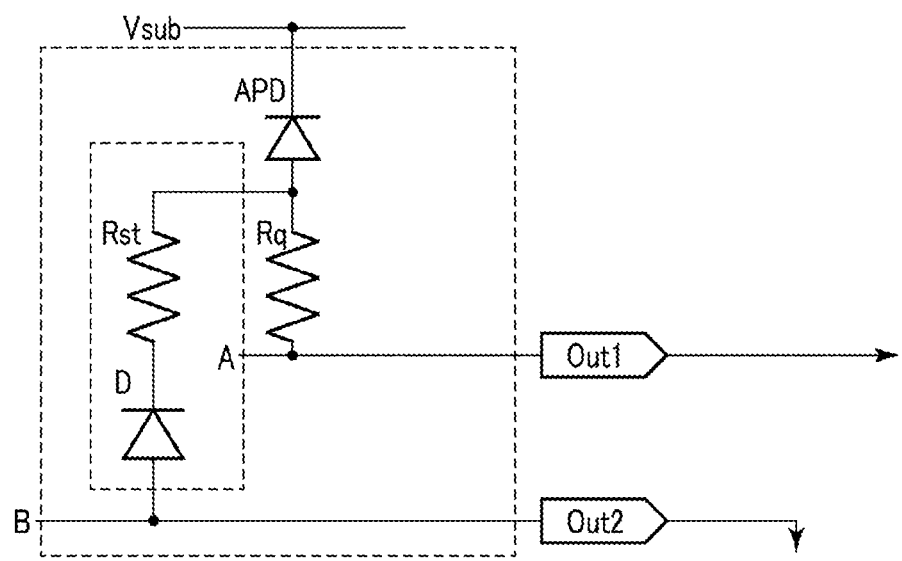

FIG. 3D illustrates a circuit configuration in a case where the diode D is reversed. For example, when the power supply voltage Vsub is −30 V, the breakdown voltage is 25 V (as typically represented as a positive number), the voltage of the output terminal Out1 is approximately 0 V, and the overvoltage operating the SPAD is 0 to −5 V (represented as 0 to 5 V without a minus sign), a specific voltage lower than or equal to −(5 V+threshold voltage of diode D) is applied to the output terminal Out2. In this case, when a decrease in voltage caused by light exceeds the applied voltage, a current flows into the diode D, and the accumulated carrier is discharged.

Figure 3E:
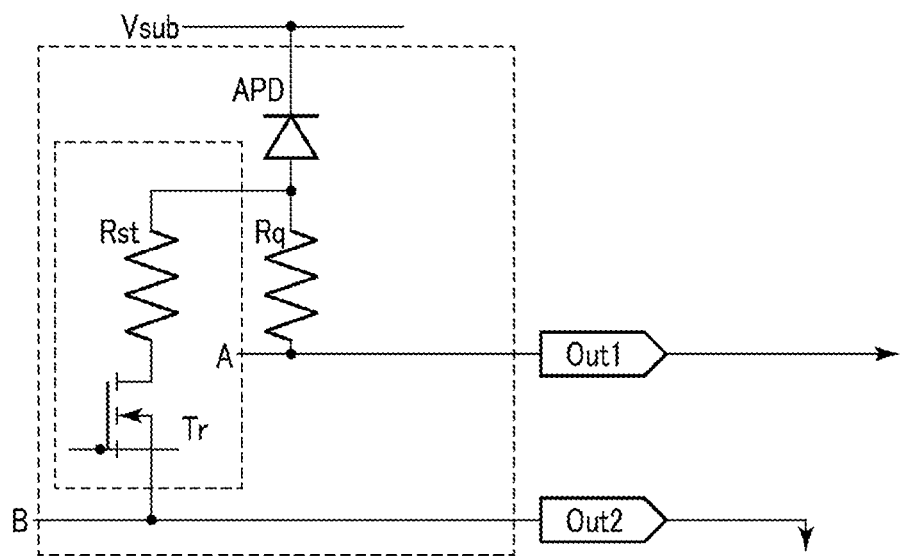

In FIG. 3E, the diode of FIG. 3D is replaced with a P-type MOS transistor Tr. For example, when the power supply voltage Vsub is −30 V, the breakdown voltage is 25 V (as typically represented as a positive number), the voltage of the output terminal Out1 is approximately 0 V, and the overvoltage operating the SPAD is 0 to −5 V (represented as 0 to 5 V without a minus sign), a specific voltage lower than or equal to −(5 V+threshold voltage of transistor) is applied to the output terminal Out2. In this case, when a decrease in voltage caused by light exceeds the applied voltage, a current flows into the transistor Tr, and the accumulated carrier is discharged. By using the high speed, high current capacity transistor Tr, the carrier can be discharged in a small amount of time.

When the diode D is replaced with a transistor Tr, the direction of the parasitic diode of the transistor Tr may be in reverse to the direction of the diode D. That is, in a case where the transistor Tr is a P-channel MOS transistor, a drain of the transistor Tr is connected to the second resistor Rst, and a source of the transistor Tr is connected to the output terminal Out2.

While FIG. 3C to FIG. 3E illustrate circuit configurations in a case where the APD has the structure in FIG. 2 and FIG. 3E illustrates a circuit configuration in a case where the APD is a P-channel MOS transistor, the structure of the APD is not limited to those cases as described above. In addition, an N-channel MOS transistor may be used instead of the P-channel MOS transistor.

Modification Example 3

Figure 4:
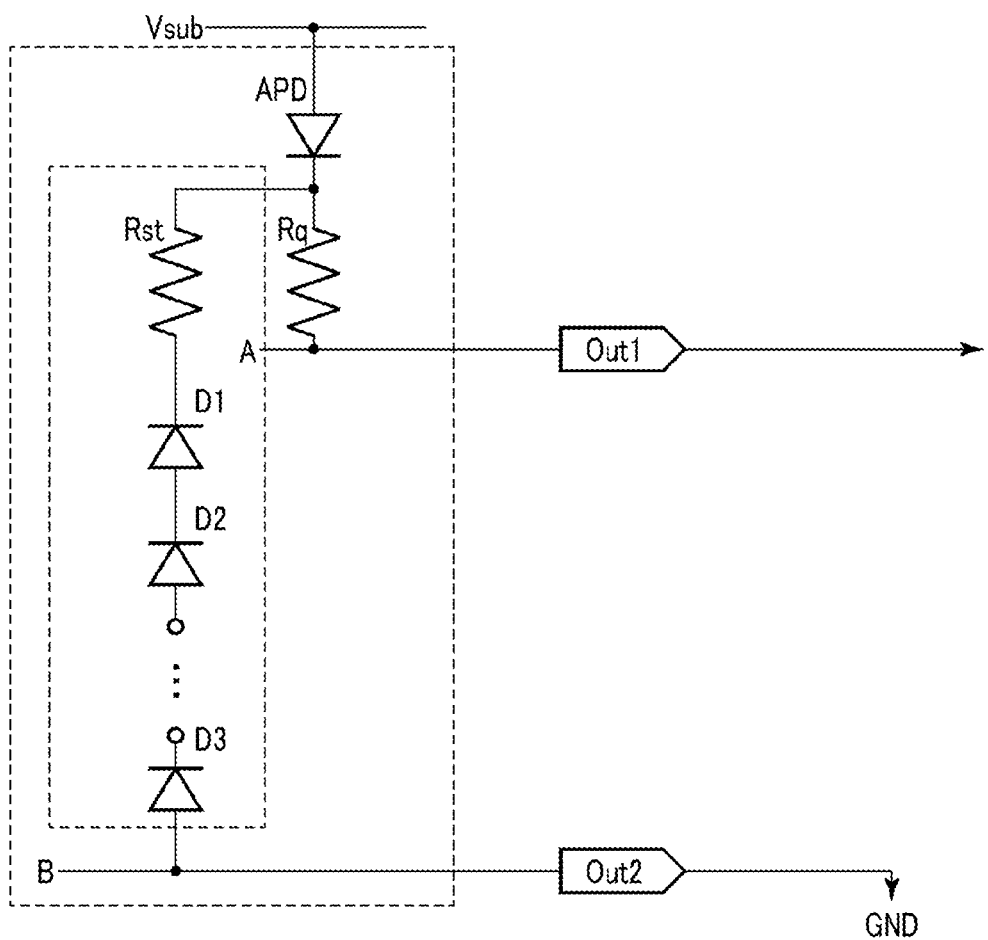
FIG. 4 is a diagram illustrating a configuration example of one SPAD in Modification Example 3.

Modification Example 3 will be described. In the above embodiment and the example illustrated in Modification Example 1, the breakdown phenomenon of the rectification element is used for promoting the discharge of the carrier from the APD. However, for example, as illustrated in FIG. 4, the same effect can be achieved by forwardly connecting a plurality of diodes D1, D2 . . . D3 to the second resistor Rst. That is, by forwardly connecting a plurality of diodes, a forward threshold voltage can be increased. By increasing the forward threshold voltage, a current does not flow at a low voltage, and a high current flows when a high voltage is applied as in the case of reversely connecting the diode. Accordingly, Modification Example 3 achieves the same effect as the above embodiment and Modification Example 1. Furthermore, when the APD is forwardly connected to the power supply, the plurality of diodes D1, D2 . . . D3 may be reversely connected to the second resistor Rst.

Modification Example 4

Figure 5A:
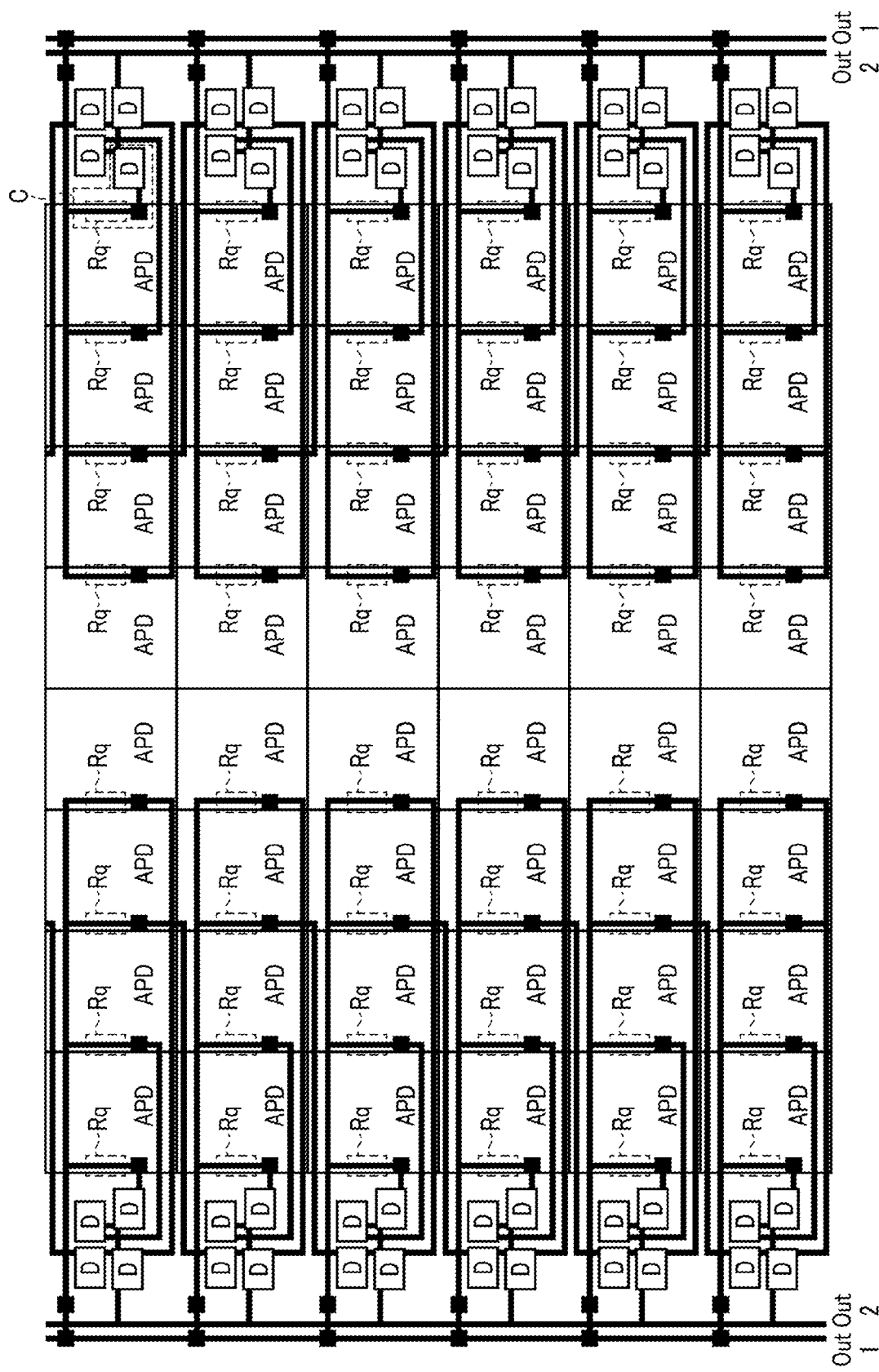
FIG. 5A is a diagram illustrating a structure of an SiPM of Modification Example 4.
Figure 5B:
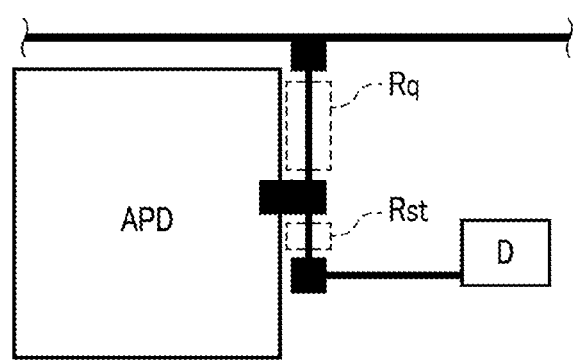
FIG. 5B is an enlarged view of a region C in FIG. 5A.

Modification Example 4 will be described. FIG. 5A is a diagram illustrating a structure of an SiPM of Modification Example 4. FIG. 5B illustrates an enlarged view of a region C in FIG. 5A. It is noted that while FIG. 5B is an enlarged view of the region C, other SPADs also include the second resistor Rst having the same connection structure as FIG. 5B. As described above, the SiPM is formed by arranging the SPADs in a multi-pixel form. For example, as illustrated in FIG. 5A, the SiPM includes a sensor region in which the SPAD including the APD and the first quench resistor Rq is 2-dimensionally arranged. In order to draw out wiring, for example, the sensor region in the example in FIG. 5A is divided into two regions in the left-right direction of the page. For example, the left-right direction is the horizontal direction when the sensor 33 is mounted in the distance measuring device 1.

In the right half region of the sensor region, wiring to the SPAD is drawn out toward the right end of the sensor region. More specifically, the first quench resistor Rq connected to the APD is arranged in a separation region that is the boundary of the SPAD in the left-right direction. The separation region is a region disposed between the SPADs in order not to propagate the carrier present in one of the adjacent SPADs to the other. The separation region may be light-shielded. The first quench resistor Rq in the SPAD of each row in the right half of the sensor region is connected to one horizontal wiring drawn out through a separation region that is the boundary of the SPAD in the up-down direction. The horizontal wiring of each row is connected to one vertical wiring at the right end of the sensor region. The vertical wiring is connected to the output terminal Out1.

Similarly, in the left half region of the sensor region, wiring of the SPAD is drawn out toward the left end of the sensor region. More specifically, the first quench resistor Rq connected to the APD is arranged in a separation region that is the boundary of the SPAD in the left-right direction. The first quench resistor Rq in the SPAD of each row in the left half of the sensor region is connected to one horizontal wiring drawn out through a separation region that is the boundary of the SPAD in the up-down direction. The horizontal wiring of each row is connected to one vertical wiring at the left end of the sensor region. The vertical wiring is connected to another output terminal Out1.

In Modification Example 4, as illustrated in FIG. 5B, the second resistor Rst and the rectification element (for example, the diode D) are connected to the first quench resistor Rq. In a case where the second resistor Rst and the rectification element are disposed in the sensor region, the opening ratio of the SPAD, that is, the light reception area of the APD, is decreased.

In Modification Example 4, the rectification element (for example, the diode D) is disposed at the end of the sensor region. In the example in FIG. 5A, the diode D of the SPAD in the right half region of the sensor region is collectively arranged at the right end of the sensor region. The diode D of the SPAD in the left half region of the sensor region is collectively arranged at the left end of the sensor region. Each diode D disposed at the right end of the sensor region is connected in common to the output terminal Out2 by wiring that is drawn out through the separation region. Similarly, each diode D disposed at the left end of the sensor region is connected in common to another output terminal Out2 by wiring that is drawn out through the separation region.

In Modification Example 4, by collectively disposing the rectification elements at the end of the sensor region, a decrease in opening ratio of each SPAD is reduced. Since a higher reverse-bias voltage than the power supply voltage of a typical circuit is applied to the APD, it is necessary to use a deep well or the like in order to provide insulation between the APD and a typical circuit, and the APD and the other circuit typically have to be separated away from each other. Accordingly, in a case where the rectification element is disposed in the sensor region unlike Modification Example 4, a large separation region is necessary, and the opening ratio is therefore decreased. In addition, connection wirings must be drawn out through the separation region.

While the sensor region is divided into two regions in the left-right direction in FIG. 5A, the sensor region is not limited to FIG. 5A. The sensor region may be divided into two regions in the up-down direction. In this case, the diode D may be separately disposed at the upper end and the lower end of the sensor region.

Modification Example 5

Figure 6:
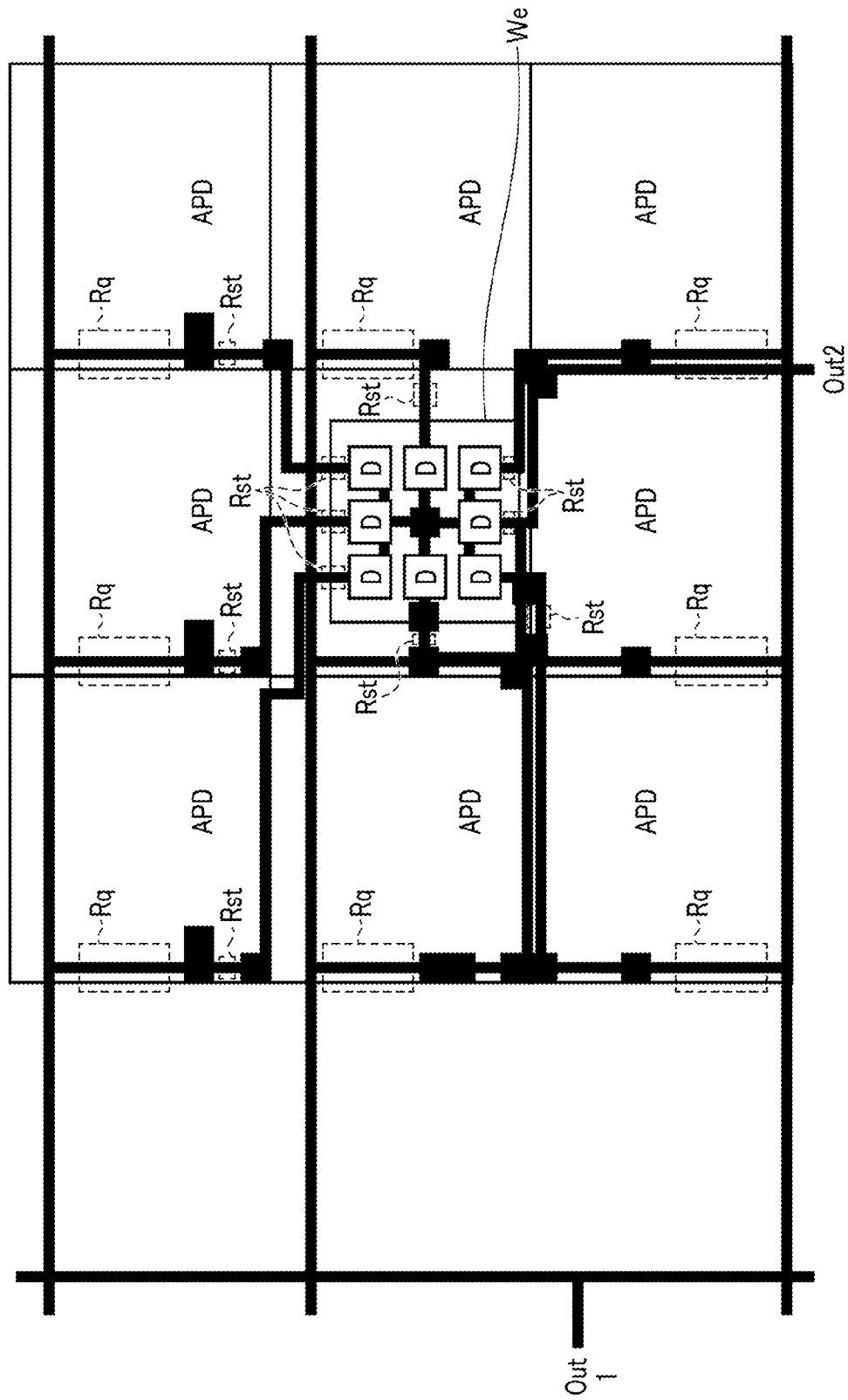
FIG. 6 is a diagram illustrating a structure of an SiPM of Modification Example 5.

Modification Example 5 will be described. FIG. 6 is a diagram illustrating a structure of an SiPM of Modification Example 5. A case where the rectification element cannot be collectively arranged at the edge of the sensor region may occur due to a constraint or the like in the manufacturing of the SiPM. In this case, as illustrated in FIG. 6, the diode D may be collectively arranged in a partial region of the sensor region in which the SPAD is to be disposed. In other words, the SPAD may be disposed in the sensor region excepting a region in which the diodes D are collectively arranged. Furthermore, while the diodes D are concentrated at one location in FIG. 6, the diodes D may be separately collected at two or more locations.

It is desirable to separate the elements of the APD and the diode D from each other using, for example, a well We or a trench structure. Such separation is for electrically separating the APD to which a high reverse-bias voltage is applied and the diode D from each other.

Modification Example 6

Figure 7:
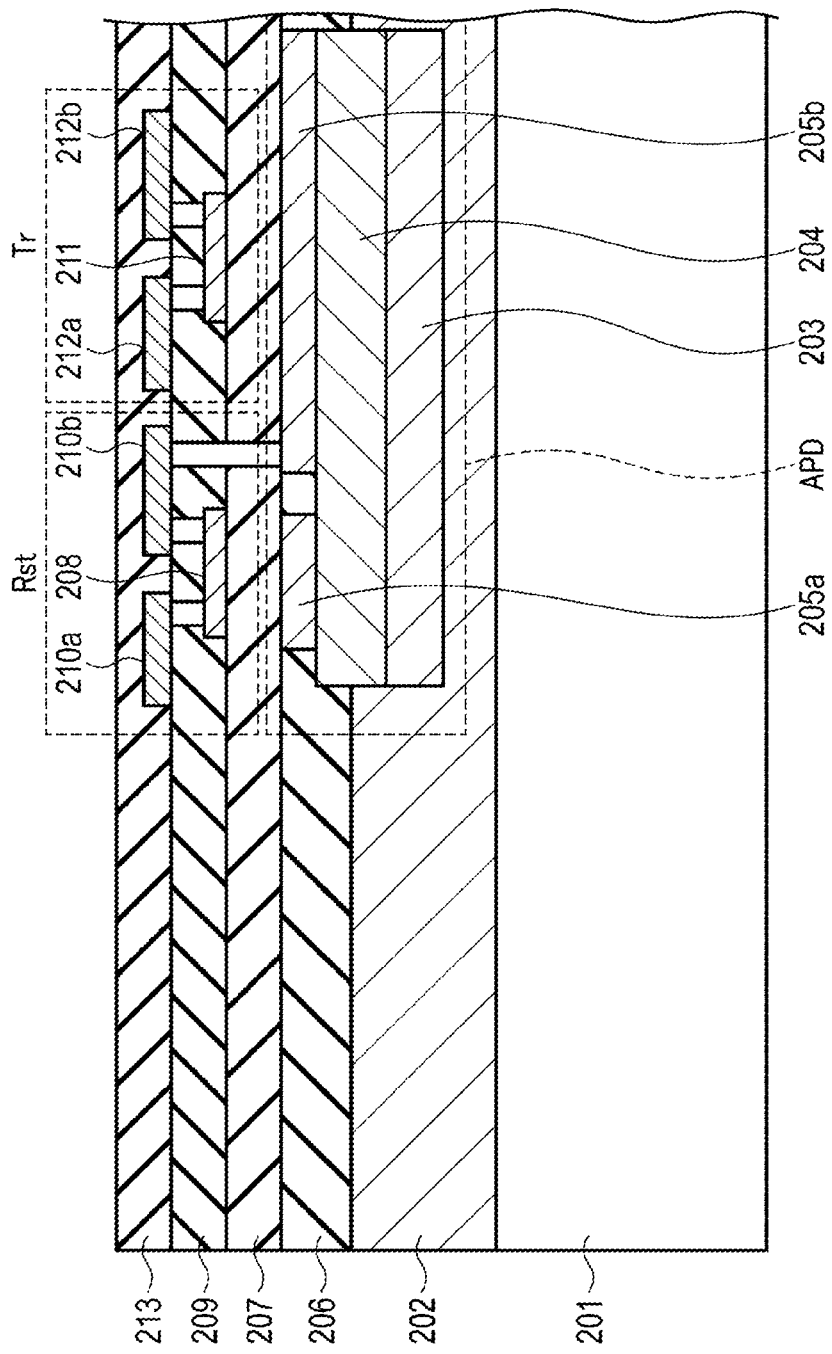
FIG. 7 is a diagram illustrating an example of forming a second resistor and a transistor as a rectification element in a layer above an APD using a thin film transistor.

Modification Example 6 will be described. The rectification element for promoting the discharge of the carrier from the APD may be formed in a layer above the APD. FIG. 7 is a diagram illustrating an example of the second resistor Rst and the transistor Tr formed as the rectification element in a layer above the APD using a thin film transistor. For example, a P-type semiconductor layer 202 is formed in a substrate 201. A P-plus-type semiconductor layer 203 and an N-plus-type semiconductor layer 204 are stacked in the P-type semiconductor layer 202. In addition, two electrodes 205a and 205b are formed in the N-plus-type semiconductor layer 204. The electrode 205a is connected to the power supply. The electrode 205b is connected to an electrode 210b of the transistor Tr constituting the second resistor Rst. The APD is formed by the P-type semiconductor layer 202, the P-plus-type semiconductor layer 203, the N-plus-type semiconductor layer 204, and the electrodes 205a and 205b.

The surrounding area of the electrodes 205a and 205b is flattened by an insulating layer 206. An insulating layer 207 is stacked on the insulating layer 206. A semiconductor layer 208 formed of, for example, InGaZnO is formed in the insulating layer 207. The semiconductor layer 208 is connected to electrodes 210a and 210b of the transistor formed through an insulating layer 209. The electrode 210a is, for example, a source electrode of the transistor. The electrode 210b is, for example, a drain electrode. The second resistor is formed by the semiconductor layer 208 and the electrodes 210a and 210b.

In addition, another semiconductor layer 211 formed of, for example, InGaZnO is formed in the insulating layer 207. The semiconductor layer 211 is connected to electrodes 212a and 212b of the transistor through the insulating layer 209. The electrode 212a is, for example, a source electrode of the transistor. The electrode 212b is, for example, a drain electrode. In addition, while illustration is not provided, the electrode 210a and the electrode 212a are connected to each other. The transistor Tr as the rectification element is formed by the semiconductor layer 211 and the electrodes 212a and 212b.

An insulating layer 213 as a protective layer is formed on the electrodes 210a, 210b, 212a, and 212b.

As illustrated in FIG. 7, by forming the second resistor Rst and the transistor Tr in the same layer, the second resistor Rst and the transistor Tr may be formed in the same step.

Figure 8A:
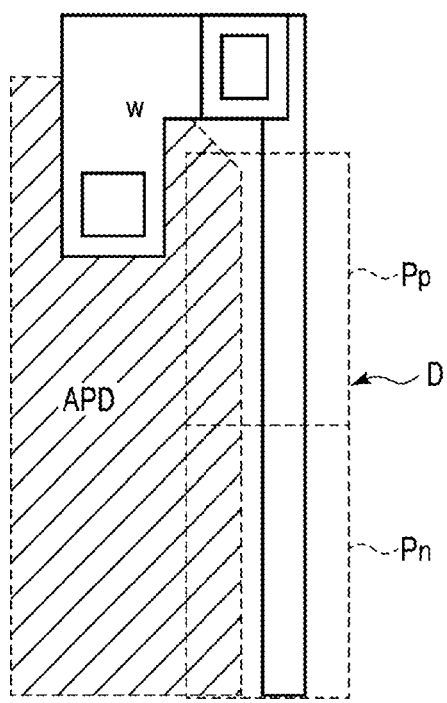
FIG. 8A is a diagram illustrating an example of forming a diode as a rectification element next to the APD using polysilicon.
Figure 8B:
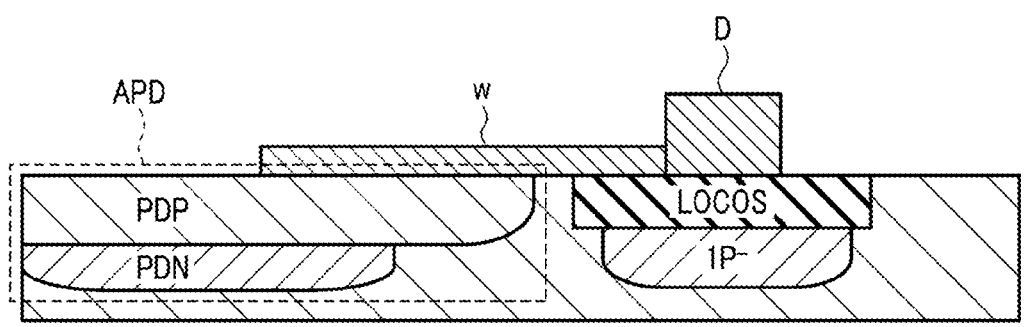
FIG. 8B is a diagram illustrating the example of forming the diode as the rectification element next to the APD using polysilicon.

In addition, the rectification element for promoting the discharge of the carrier from the APD may be formed separately from the APD. FIG. 8A and FIG. 8B are diagrams illustrating an example of forming the diode D as the rectification element next to the APD using polysilicon. As illustrated in FIG. 8A, the diode D is connected to the APD through wiring W. For example, the diode D includes a junction between a polysilicon layer Pp in which a P-type impurity is introduced and a polysilicon layer Pn in which an N-type impurity is introduced. As illustrated in FIG. 8B, the elements of the APD and the diode D are separated from each other by a local oxidation of silicon (LOCOS) layer. In FIG. 8B, it is noted that PDN denotes an N-plus-type semiconductor layer constituting the APD, PDP denotes a P-plus-type semiconductor layer constituting the APD, and 1P$^-$ denotes a diffusion layer.

In Modification Example 6, it is not necessary to form the rectification element or the like in the sensor region. Thus, the opening ratio of each SPAD is not reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A sensor, comprising:
   an avalanche photodiode (APD);
   a first resistor between a current output terminal of the APD and a first output terminal; and
   a second resistor and a diode in series between the current output terminal and a second output terminal, the diode being between the second resistor and the second output terminal and having a breakdown voltage of which absolute value is equal to or greater than an absolute value of an overvoltage of the APD.

2. The sensor according to claim 1, wherein a resistance value of the second resistor is lower than a resistance value of the first resistor.

3. The sensor according to claim 1, wherein
   the APD is connected in a forward direction, and
   the diode is connected in a forward direction.

4. The sensor according to claim 1, wherein
   the APD is connected in a reverse direction, and
   the diode is connected in a reverse direction.

5. The sensor according to claim 1, wherein
   the diode is a Zener diode,
   the APD is connected in a forward direction, and
   the Zener diode is connected in a forward direction.

6. The sensor according to claim 1, wherein
   the diode is a Zener diode,
   the APD is connected in a reverse direction, and
   the Zener diode is connected in a reverse direction.

7. The sensor according to claim 1, wherein
   the sensor includes an array of sensor elements, and
   the sensor elements are connected to the first output terminal in common and to the second output terminal in common.

8. The sensor according to claim 1, wherein
   a cathode of the APD is connected to the first resistor and the second resistor, and
   an anode of the diode is connected to the second resistor, and a cathode of the diode is connected to the second output terminal.

9. The sensor according to claim 1, wherein
an anode of the APD is connected to the first resistor and the second resistor, and
an anode of the diode is connected to the second output terminal, and a cathode of the diode is connected to the second resistor.

10. A sensor, comprising:
a first sensor element and a second sensor element; and
a first output terminal and a second output terminal;
the first sensor element comprising:
   a first avalanche photodiode (APD) in a first region of a substrate;
   a first resistor connected between a current output terminal of the first APD and the first output terminal; and
   a second resistor and a first rectification element connected in series between the current output terminal of the first APD and the second output terminal, the first rectification element being connected between the second resistor and the second output terminal,
the second sensor element comprising:
   a second APD in a second region of the substrate, the second region being aligned with the first region in a first direction;
   a third resistor connected between a current output terminal of the second APD and the first output terminal; and
   a fourth resistor and a second rectification element connected in series between the current output terminal of the second APD and the second output terminal, the second rectification element being connected between the fourth resistor and the second output terminal, wherein
the first and second rectification elements are in a third region of the substrate.

11. The sensor according to claim 10, wherein the third region is aligned with the first and second regions in the first direction.

12. The sensor according to claim 10, wherein
the first resistor is between the first APD and the second APD, and
the third resistor is between the second APD and the third region.

13. The sensor according to claim 10, wherein the first region and the second region are in a central region, and the third region is outside the central region.

14. The sensor according to claim 10, wherein the third region is aligned with the first region in a second direction crossing the first direction.

15. The sensor according to claim 10, wherein the third region is surrounded by a plurality of APDs including the first APD and the second APD.

16. A distance measuring device, comprising:
an optical unit configured to direct light toward a target object;
a sensor configured to receive light reflected by the target object; and
a processor configured to determine a distance to the target object based on a signal output from the sensor,
the sensor comprising:
   an avalanche photodiode (APD);
   a first resistor between a current output terminal of the APD and the first output terminal; and
   a second resistor and a rectification element in series between the current output terminal and a second output terminal of the sensor, the rectification element being between the second resistor and the second output terminal.

* * * * *